(12) United States Patent
Cheng et al.

(10) Patent No.: US 9,189,588 B2
(45) Date of Patent: Nov. 17, 2015

(54) POLYGON-BASED OPTICAL PROXIMITY CORRECTION

(71) Applicant: TAIWAN SEMICONDUCTOR MANUFACTURING COMPANY, LTD., Hsin-Chu (TW)

(72) Inventors: Wen-Li Cheng, Taipei (TW); Ming-Hui Chih, Luzhou (TW); Yu-Po Tang, Taipei (TW); Chia-Ping Chiang, Taipei (TW); Cheng-Lung Tsai, Hsin-Chu (TW); Sheng-Wen Lin, Kaohsiung (TW); Kuei-Liang Lu, Hsinchu (TW); Wen-Chun Huang, Tainan (TW); Ru-Gun Liu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 52 days.

(21) Appl. No.: 14/102,350

(22) Filed: Dec. 10, 2013

(65) Prior Publication Data

US 2015/0161321 A1 Jun. 11, 2015

(51) Int. Cl.
*G06F 17/50* (2006.01)

(52) U.S. Cl.
CPC ................ *G06F 17/5081* (2013.01)

(58) Field of Classification Search
CPC .................................... G03F 1/144
USPC ................................... 716/53
See application file for complete search history.

(56) References Cited

U.S. PATENT DOCUMENTS

| | | | |
|---|---|---|---|
| 6,625,801 B1* | 9/2003 | Pierrat et al. | 716/53 |
| 7,082,596 B2* | 7/2006 | Liu | 716/52 |
| 2002/0188924 A1* | 12/2002 | Pierrat et al. | 716/19 |
| 2003/0118917 A1* | 6/2003 | Zhang et al. | 430/5 |
| 2004/0219436 A1* | 11/2004 | Zhang | 430/5 |
| 2005/0081179 A1 | 4/2005 | Melvin, III | |
| 2013/0000505 A1* | 1/2013 | Tao et al. | 101/450.1 |
| 2013/0239071 A1* | 9/2013 | Chang et al. | 716/53 |
| 2013/0246981 A1* | 9/2013 | Chiang et al. | 716/53 |

* cited by examiner

*Primary Examiner* — Suresh Memula
(74) *Attorney, Agent, or Firm* — Haynes and Boone, LLP

(57) ABSTRACT

Methods and systems for design of integrated circuits including performing OPC are discussed. In one embodiment, design data having a geometric feature is provided. A base feature is formed from the geometric feature, which has a substantially linear edge. A pseudo dissection point is determined on the base feature. Add or trim a polygon from the base feature to form a modified feature. An OPC process is performed on the modified feature to generate an output design. The output design is used to fabricate a semiconductor device on a semiconductor substrate.

20 Claims, 15 Drawing Sheets

POLYGON-BASED OPTICAL PROXIMITY CORRECTION

BACKGROUND

The present disclosure relates to optical proximity correction (OPC) or resolution enhancement technologies (RET).

Fabrication and design of semiconductor devices, such as integrated circuits, is becoming more and more challenging as semiconductor technology nodes are progressively decreasing to small feature sizes.

In a design flow for an IC, it is typical to transform design data into a physical design or layout that describes specific geometric elements. The geometric elements, which can include various types of polygons, define the shapes that will be created in various materials to manufacture the circuit. A GDSII file is a typical representation of a layout. The design defined by the layout is produced onto various layers disposed on a semiconductor substrate. In doing so, it is typical for there to be numerous optical lithography processes. As the technology nodes decrease however, accurately reproducing the layout is becoming more and more difficult as optical effects can cause unwanted distortions in the printed features. These distortions include regions, such as in a critical dimension (CD) feature, have poor fidelity with the design data (e.g., ripple, narrowing of the line, etc.).

To account for these distortions, or potential distortions, typical design flows include various optical proximity correction (OPC) operations, also referred to as resolution enhancement techniques (RET). These techniques include adding additional features onto a photomask defining the layout (e.g., scattering bars). These techniques also include adjusting a polygon or geometrical element of the layout so that the printed feature will more accurately reflect the desired feature. In typical OPC processes, the edges of the geometric elements (polygons) are divided into segments, and each edge segment is adjusted to reflect the desired modifications. The adjustment is typically performed based on deviation between the desired layout and a simulated printed layout. While performing OPC on layout design data can improve the fidelity of the lithographic process, OPC can be expensive in terms of time, resources (e.g., computing and engineering), and/or photomask complexity. For example, having smaller and smaller edge segments may improve the fidelity but the computational time and power needed to process these segments for a complex IC design may be problematic.

Therefore, while the typical methods of OPC are suitable, what are needed are OPC methods that provide for suitable fidelity while improving upon one or more of the above mentioned challenges.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

The terms optical proximity correction (OPC) operations and resolution enhancement techniques (RET) are used herein to refer to generally any correction for a printing, proximity, or process effect. The corrections may include changing the pattern on a photomask including modifying features, adding features, and omitting features from the photomask (e.g., scattering bars, serifs, hammerheads, edge adjustment) and alterations to the lithography process (e.g., recipe). The data, masks, systems and methods described herein are used during the process of manufacturing a semiconductor device such as an integrated circuit (IC). However, other applications of aspects of the present disclosure are also understood as possible and within the scope of the present disclosure.

Figure 1:
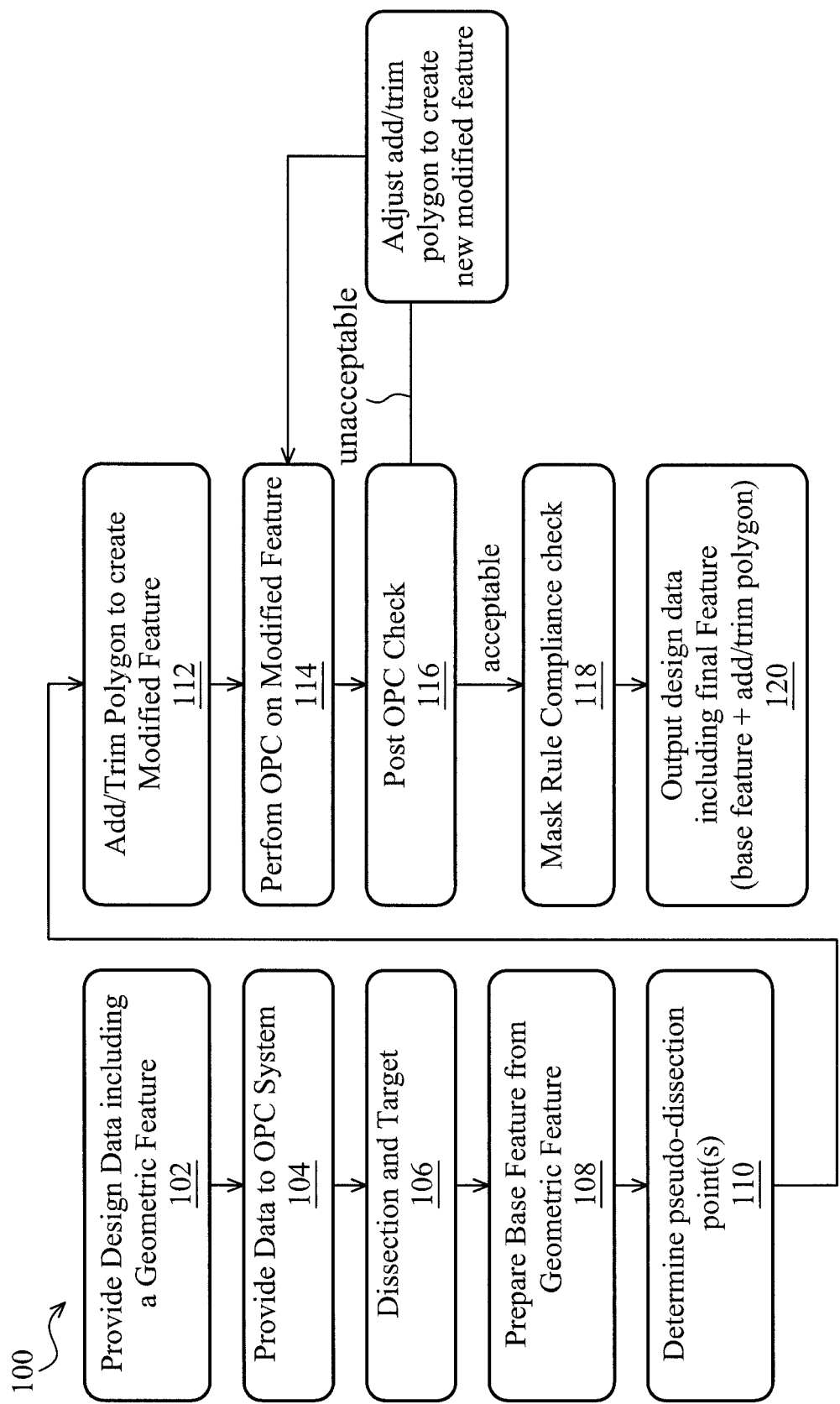
FIG. 1 is a flow chart of an embodiment of a method of optical proximity correction (OPC) for design data according to one or more aspects of the present disclosure.

Illustrated in FIG. 1 is a method 100 of designing a semiconductor device. The method 100 includes a method of performing optical proximity correction (OPC), also referred to herein as resolution enhancement techniques (RET), on a semiconductor device such as an IC.

The method 100 begins at block 102 where design data having a geometric feature is provided. In an embodiment, the design data is in the format of a layout file produced by a design system such as a layout system. A layout system typically takes a design defined by a register transfer level (RTL) description. The layout system can perform a number of functions of physical design such as synthesis, place and route, and/or verification. In an embodiment, the design data provided in block 102 is in a format having geometrical shapes, or polygons such as in a graphic database system or gds (e.g., GDSII) format. The design data of block 102 may have completed verification checks such as design rule checking (DRC), layout versus schematic (LVS), parasitic extractions, electrical rule checking (ERC) and the like. In an embodiment, the design data is stored and/or supplied by the information handling system 1500, described below with reference to FIG. 15. Exemplary design data, including in a layout form, is illustrated in FIGS. 2-14.

The design data may represent a semiconductor device (e.g., integrated circuit) including various features such as, for example, active regions, gate structures, source regions, drain regions, interconnect lines, interconnect vias, contacts, isolation regions, and/or other features typical of semiconductor devices. The design data may have been fractured into a plurality of geometric shapes (e.g., polygons) that represent the features of the semiconductor device, for example, defining their shape to be produced on a photomask. In an embodiment, the design data includes a main feature, which is a polygon that is to be formed on the photomask. As the term is used herein, polygon includes any multiple straight sided figures including a geometric figure representing a line having a given width.

The method 100 then proceeds to block 104 where the design data (e.g., layout) is provided to an OPC system. In an embodiment, the OPC system is an information handling system such as described below with reference to FIG. 15. The OPC system may also be referred to as a post-processing system, which can perform OPC or RET to facilitate the printing of the layout defined by the design data of block 102 onto a substrate. The OPC system may include rule-based, model-based analysis, table-based and other now-known or later developed capabilities.

As illustrated in block 106, the OPC system can fracture or dissect the design data using known techniques. In an embodiment, the OPC system dissects one or more of the geometrical shapes of the design data (e.g., polygons) into a plurality of segments. The segments are defined by the dissection points; in other words, a portion of the edge of the dissected feature between two adjacent dissection points defines a segment. Any number of segments may be provided. Referring to the example of FIG. 2, a geometrical feature 202 is illustrated. The geometrical feature 202 may be a feature of design data such as described above with reference to block 102. In an embodiment, the geometrical feature 202 is defined in a layout file such as a gds file. The geometrical feature 202 may be referred to herein as an original mask feature. In embodiments, the original mask feature is a feature having been modified from an as-drawn feature based on standard OPC methods and systems, for example, to include jogs and other features to improve fidelity of the printed feature with the as-drawn feature. In other embodiments, the geometrical feature 202 may be an as-drawn feature defined by a layout. The geometrical feature 202 has been dissected into a plurality of segments 204 (e.g., edge portions) defined by dissection points 206. Although the geometrical feature 202 illustrates substantially symmetric and equal length segments, other embodiments including those of varying lengths and asymmetry are possible. Further, segmenting/targeting corners and center segments is also possible. It is noted that geometrical feature 202 is a polygon. The geometrical feature 202 has a non-linear edge (e.g., an edge having "jogs" such that portions of the edge are not linearly aligned (not collinear)).

In an embodiment, the dissection of the design data in block 106 includes defining a target for one or more (or each) of the segments. The targets may be assigned for simulation verification or other design purposes and represents a special replacement relative to the feature. For example, when running a simulation the target may be used to determine whether the simulated contour of the feature (e.g., simulated as-printed feature) corresponds to the as-drawn feature.

In an embodiment, an OPC method is applied to the dissected design data. The OPC places, omits and/or modifies one or more features in the design data. A simulation is then performed using the targets for each segment to determine the adequacy or fidelity of the simulated as-printed feature. In a conventional OPC method, if the fidelity or uniformity is inadequate the feature is dissected again and retargeted before OPC methods are again ran. This is obviously consuming in time, engineering and computing resources. Thus, the method 100 provides an embodiment of a method were the dissection/targeting is NOT repeated. In other words, when the dissection and targeting of block 106 is performed a single time, it need not be repeated.

Figure 2:
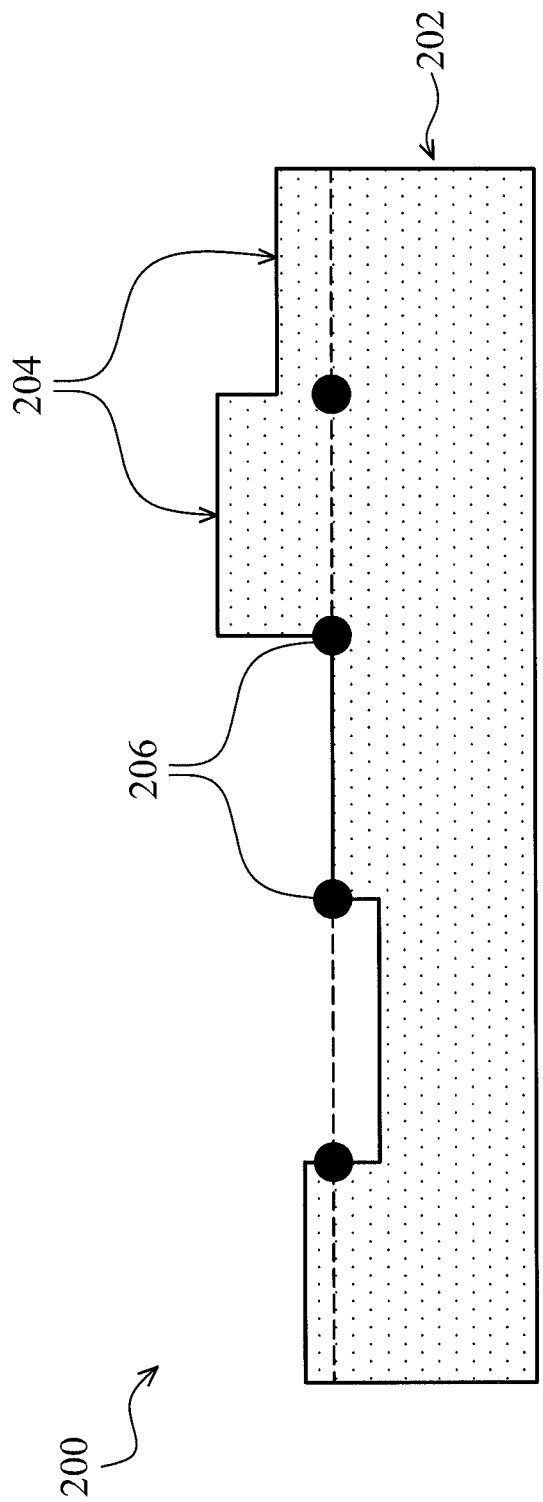
FIGS. 2-14 are illustrative of embodiments of layouts of features defined according to one or more steps of the method of FIG. 1.
Figure 3:
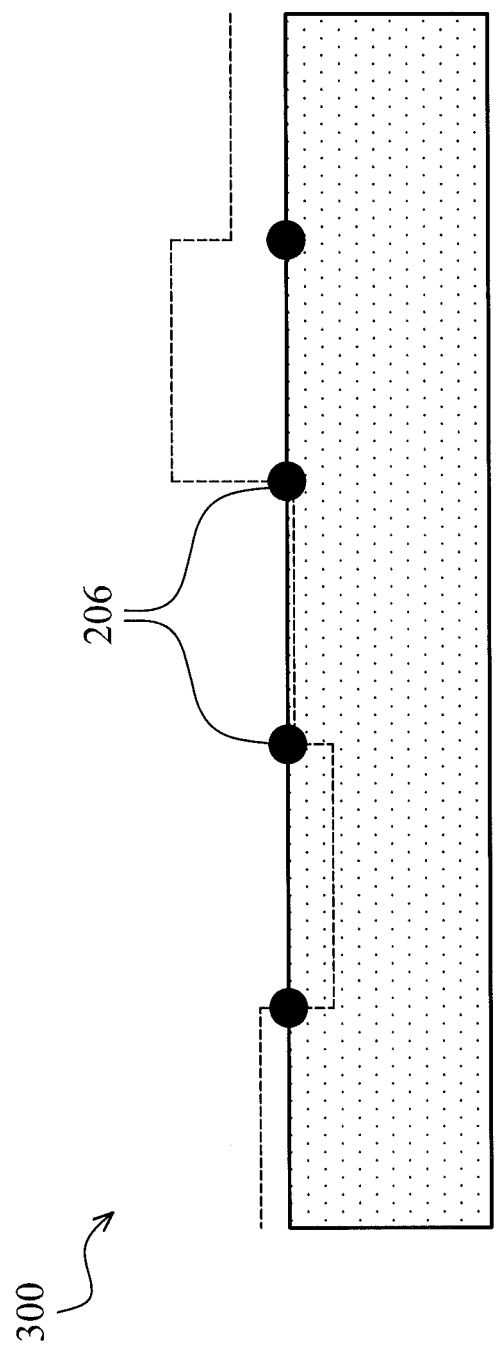

The method 100 then proceeds to block 108 where a base feature is prepared from the geometric feature. In an embodiment, the base feature simplifies the polygon of the geometric feature of block 102 (and 106), for example, providing a linear edge. For example, the edge of each segment may be made collinear. In an embodiment, the base feature is the as-drawn feature of a design data (e.g., prior to any OPC being applied). The base feature may include one or more segments. In an embodiment, one as drawn feature (e.g., interconnect line) may be provided as one base feature. In another embodiment, one as drawn feature may be provided as multiple base features. Referring to the example of FIG. 3, a base feature 300 is provided from the geometrical feature 202 (FIG. 2). The original feature 202 edges are illustrated in dashed-lines in FIG. 3. The base feature 300 is a polygon in the form of a rectangle; however other embodiments may be possible.

Figure 4:
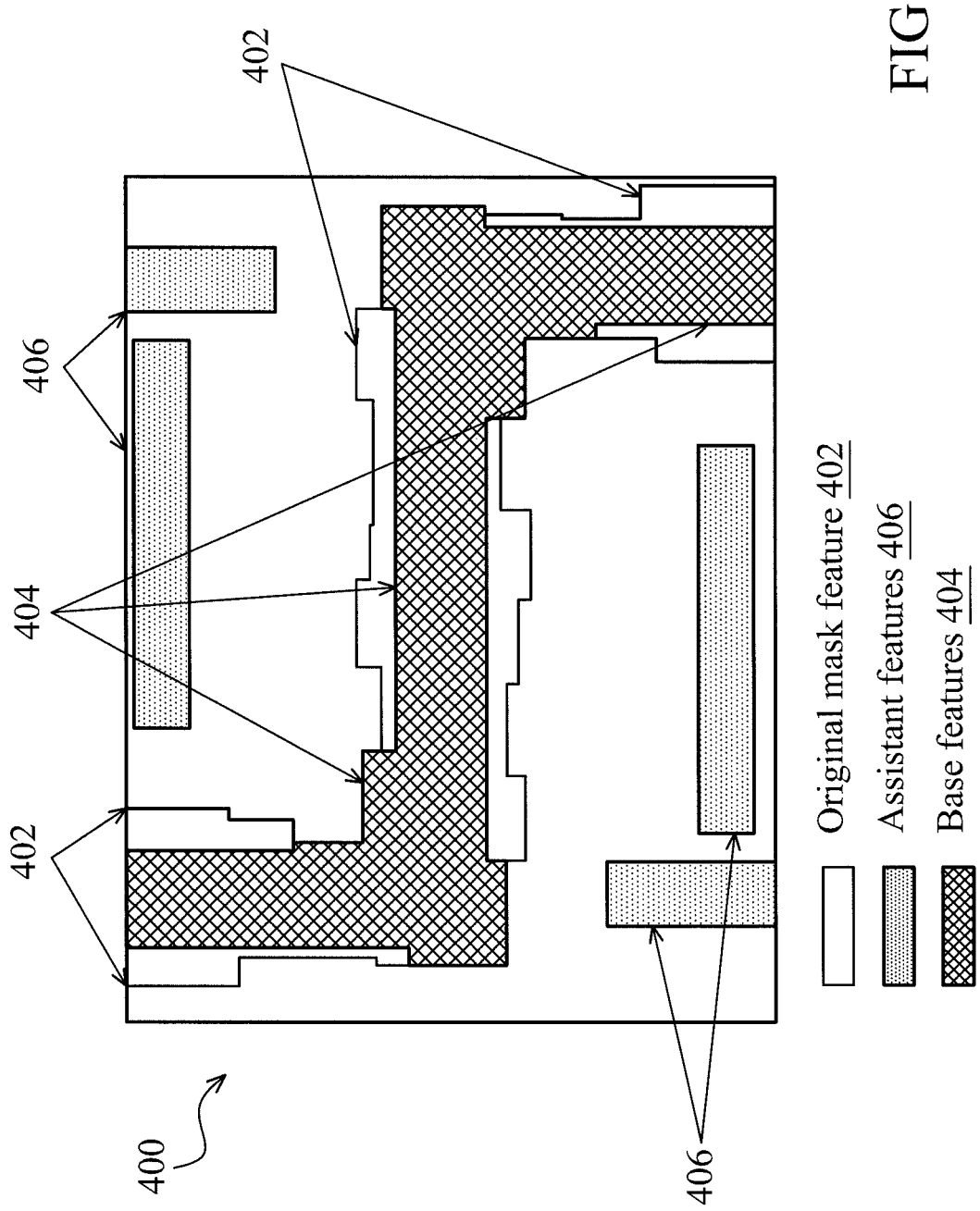
Figure 5:
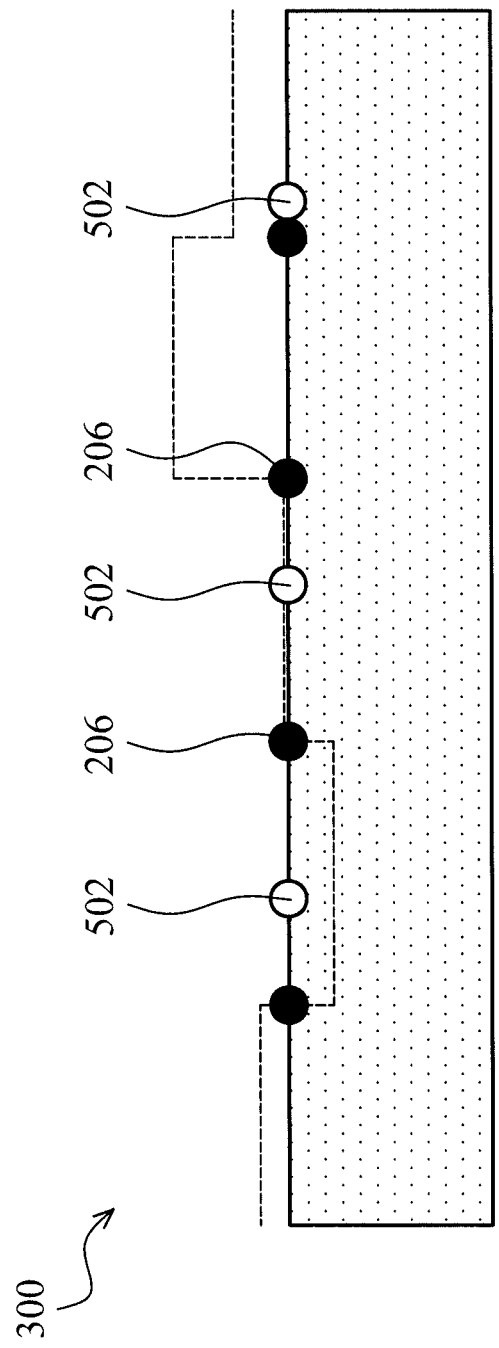
Figure 6:
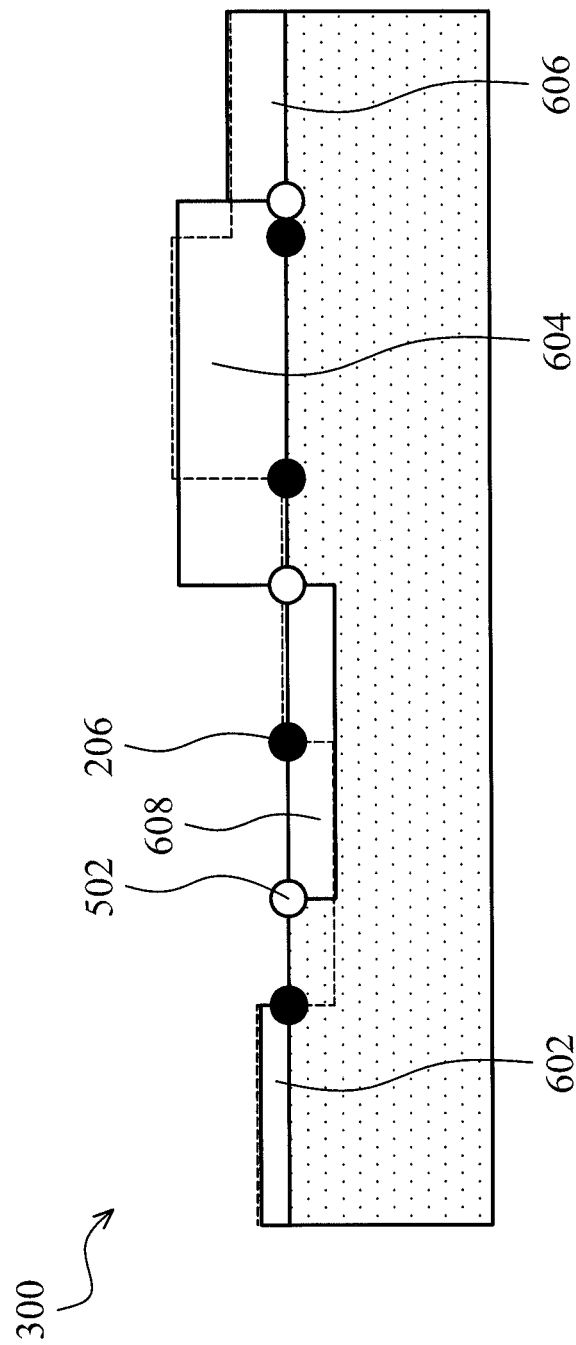

FIG. 4 is a layout view 400 illustrative of original mask features 402 (e.g., geometrical features) such as described above with reference to block 106 of FIG. 1, and geometrical feature 200 of FIG. 2. The layout view 400 further includes base features 404, such as described above with reference to block 108 of FIG. 1 and base feature 300 of FIG. 3. Assistant features such as scattering bars are illustrated as features 406, which may be placed by an OPC system based on the creation of the original feature 402 (e.g., from an as-drawn feature) using OPC methods (e.g., rule-based or model-based OPC).

The method 100 then proceeds to block 110 where one or more pseudo-dissection points are determined. The pseudo-dissection points may be applied to the base feature, described above with reference to block 108. The pseudo-dissection points may be determined based on intensity inflection points, trial-and-error, guessing, simulations, spatial relationships to the dissection points, and/or other methods. The placement of the pseudo-dissection points may be model-based or rule-based. Referring to the example of FIG. 5, the base feature 300 is illustrated having pseudo-dissection points 502 disposed thereon.

The method 100 then proceeds to block 112 where polygons (or other geometrical shapes) are added or trimmed from the base feature to create a modified feature. The added polygons may be "temporary" as in there will later be modified as described below. In an embodiment, the polygons are added/trimmed based on the pseudo-dissection points. For example, in an embodiment, the pseudo-dissection points define an edge of a polygon. In an embodiment, each pseudo-dissection point defines at least one edge of an added/trimmed polygon. In an embodiment, the polygons added/trimmed are also based on the original mask feature. In an embodiment, the height of each added/trimmed polygon is determined by a distance of original feature to a base feature, by intensity of a target point, by an initial guess value, a model, experimental data, and/or other suitable techniques. Referring to the example of FIG. 6, the base feature 300 has polygons 602, 604 and 606 added and polygon 608 trimmed (e.g., region removed from the base feature 300).

Figure 7:
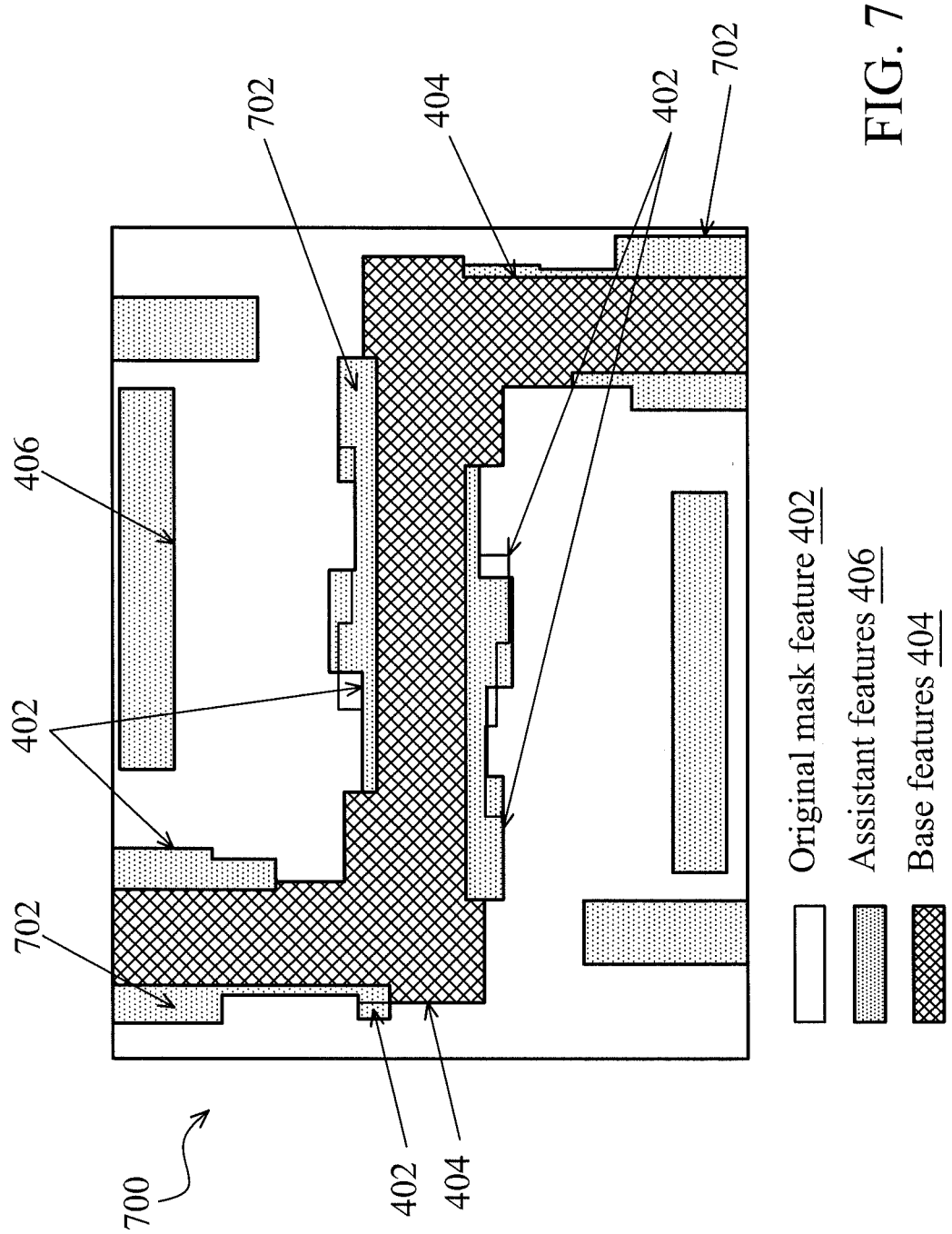

FIG. 7 illustrates a layout 700 of the design data illustrative after block 112 of the method 100. As illustrated by a comparison of FIG. 4, additional features 702 are added based on the temporary polygons provided in block 112.

Figure 8:
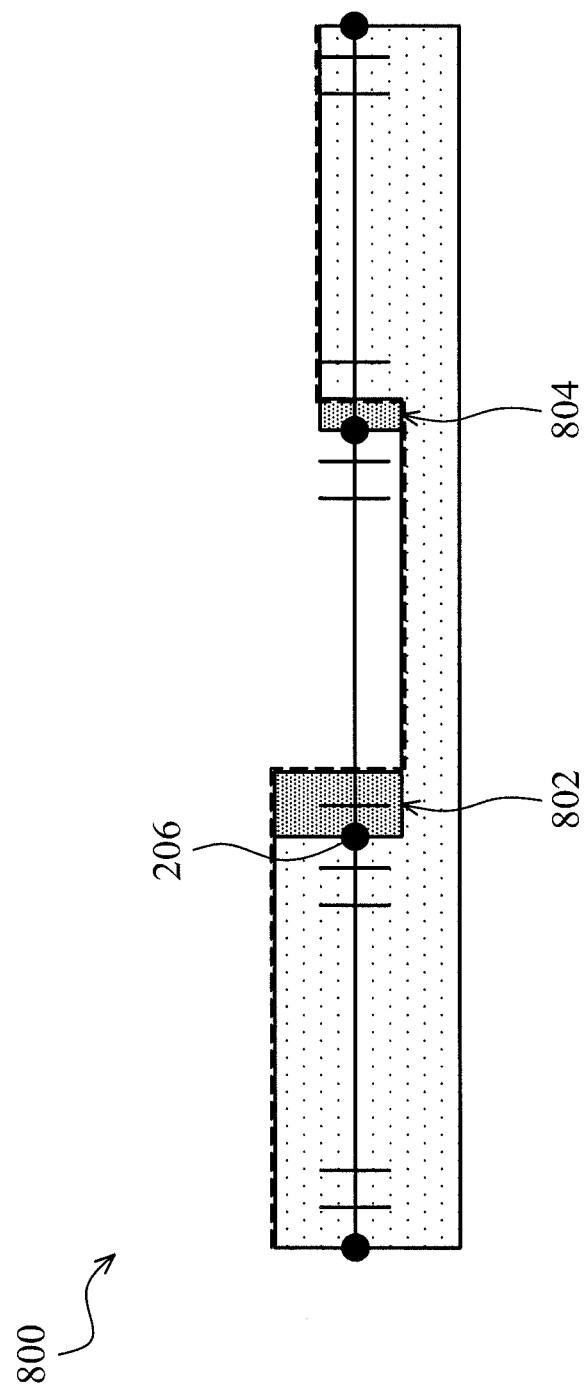
Figure 9:
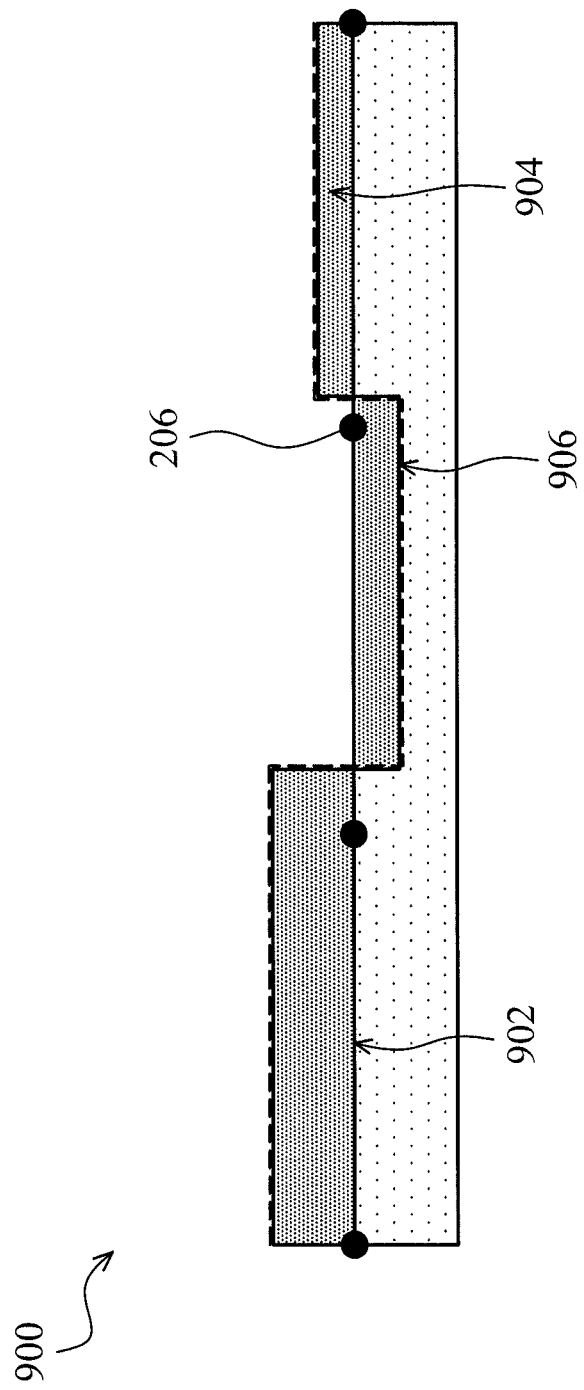

FIGS. 8 and 9 are also exemplary of a feature 800 having polygons added or trimmed. FIG. 8 illustrates the modification of polygons on a segment's edge of the feature 800. Specifically, polygon 802 is added to a segment edge on feature 800. A polygon 804 is trimmed (e.g., removed) from the feature 800 at another segment edge of feature 800. The polygons 802 and/or 804 may be determined using a rule-based methodology using the method of FIG. 1. FIG. 9 illustrates the modification of polygons on a segment's edge of the feature 900. In an embodiment, the feature 900 is a base feature such as described above with reference to block 108. Specifically, polygons 902 and 904 are added to the feature 900. A polygon 906 is trimmed (e.g., removed) from the feature 900. The polygons 902, 904, and/or 906 may be determined using a model-based methodology using the method of FIG. 1. It is noted that FIG. 9 illustrates a two-dimensional polygon based correction method applied. In other words, the polygons alter the shape of the feature in both the x and y directions (horizontal and vertical with respect to the figures).

After adding/trimming the polygons, the method 100 proceeds to block 114 where OPC is performed on the modified feature (e.g., feature having added/trimmed polygons). The OPC may be a rule-based OPC, a model-based OPC, a table-based OPC, and/or other OPC/RET methods now known or later developed. In an embodiment, the OPC is run using the targets provided in block 106. However, in an embodiment, the OPC does not use the dissection points, or segments, generated in block 106. The OPC may align the polygons as added/trimmed.

During an embodiment of block 114, during OPC (including the iterations of OPC as discussed below), the pseudo-dissection points can be modified as required by the OPC output. The modification may be performed dynamically. When a pseudo-dissection point is modified in its position, polygon dimensions are updated. For example, when a given pseudo-dissection point is modified two polygons defined by the point need to be modified—i.e., in width.

Figure 10:
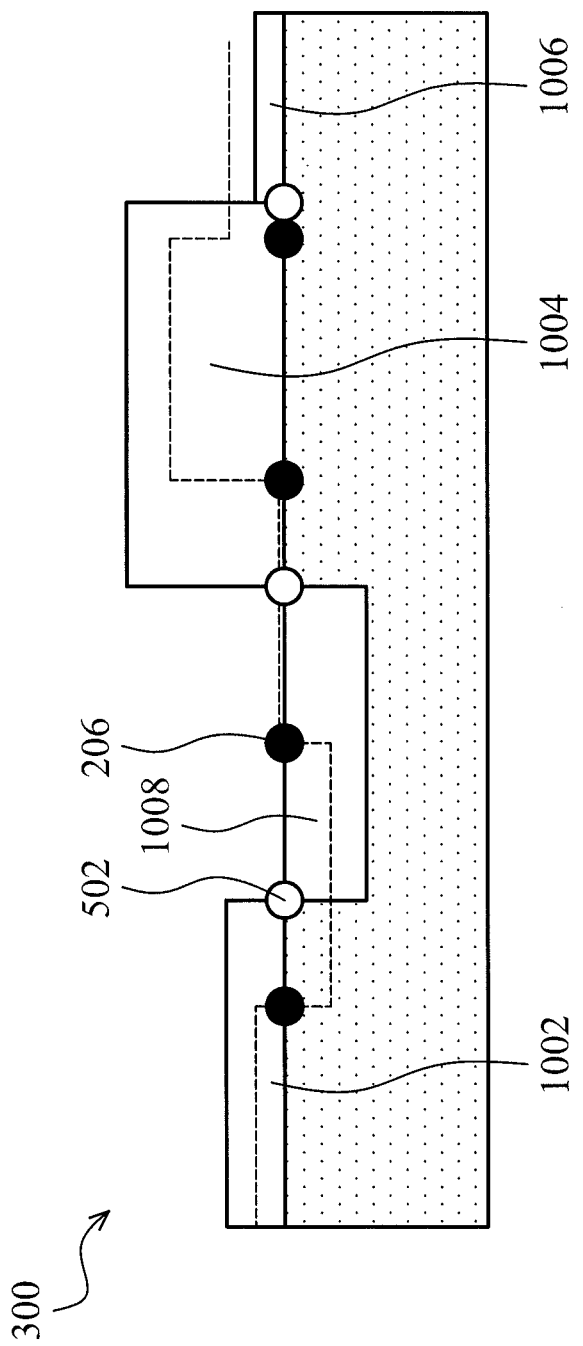

Referring to the example of FIG. 10, the base feature 300 having polygons added/trimmed is illustrated. The feature of FIG. 10 is illustrated after at least one OPC is run on the base feature having polygons added/trimmed. The OPC modifies the polygons added or trimmed. In one embodiment, the modification includes modifying the height of one or more polygons (e.g., a distance from the base feature edge). In an embodiment, the OPC does not modify the base feature. As illustrated by a comparison of FIG. 6 and FIG. 10, the added polygons have been modified (e.g., in height). FIG. 10 illustrates polygon 1002 modified from polygon 602 of FIG. 6, polygon 1004 modified from polygon 604 of FIG. 6, and polygon 1006, modified from polygon 606 of FIG. 6. As illustrated above, the OPC illustrates a modification of the position of the pseudo-dissection points and thus, the width of the add/trim polygons.

Figure 11:
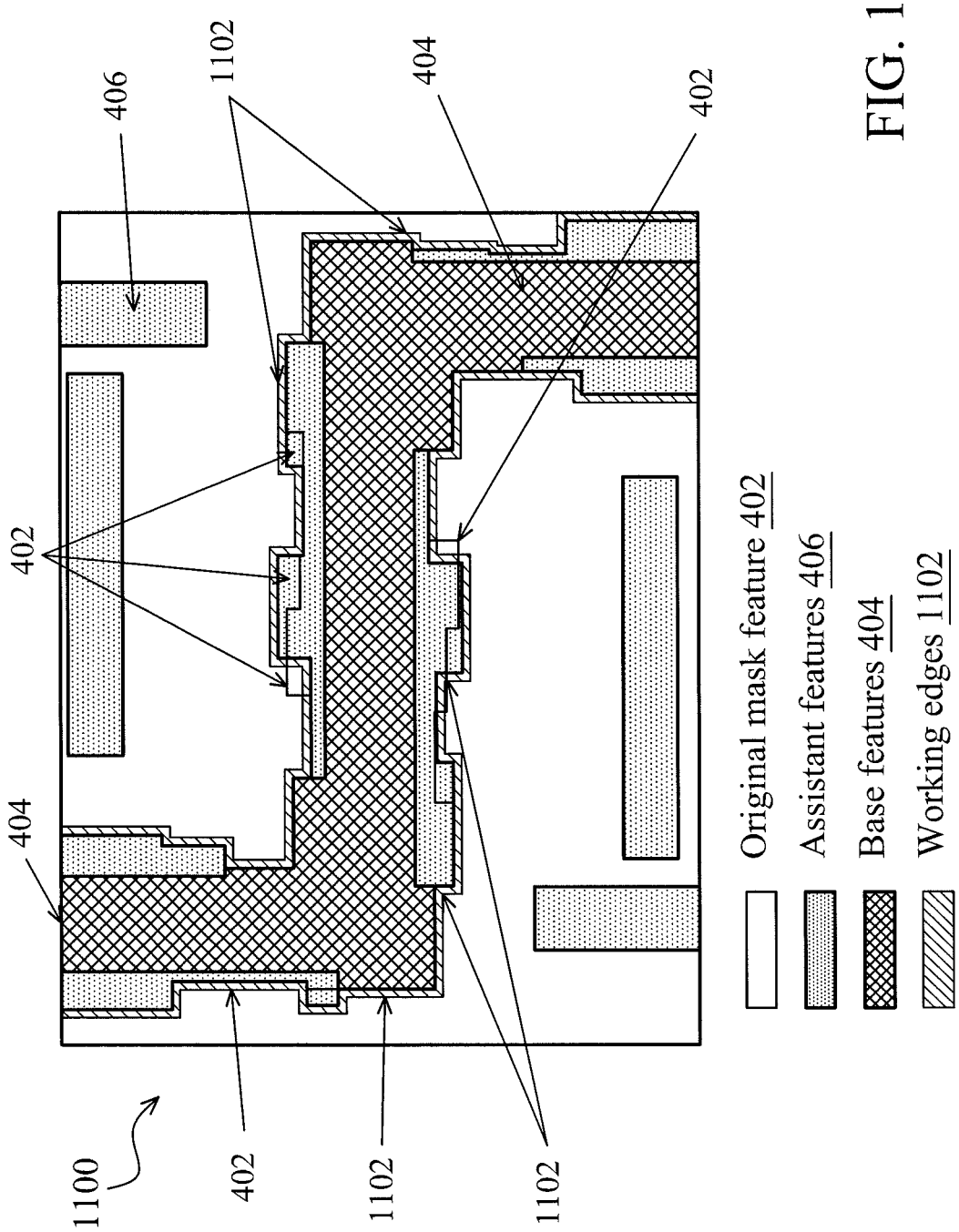

FIG. 11 illustrates a layout 1100 of the design data illustrative after block 114 of the method 100. As illustrated by a comparison of FIG. 7, the added/trimmed polygons provide for a working feature 1102 illustrated by outlines.

The method 100 then proceeds to block 116 where a post-OPC verification or check is performed. The post-OPC verification may include running simulations to determine if the final feature as printed meets the desired and/or required fidelity or contour for the feature. For example, in one embodiment, the uniformity of the critical dimension (CD) for the feature and/or features of the layout is determined. If the verification finds the printed feature unacceptable, the method 100 returns to block 114 where OPC is run again on the modified feature. This OPC may further modify the polygons appended to/trimmed from the main feature(s). This OPC may also modify the location of the pseudo-dissection points. These steps may be iterated any number of times. The iteration may include rule-based OPC, model-based OPC or combinations thereof. However, it is noted that in embodiments, the original dissection points (for example as discussed in block 108) are not moved in any of the iterations. In an embodiment, the targets are not modified.

If the verification after OPC is found acceptable, the method 100 progresses to block 118 where a mask rule compliance (MRC) verification step is performed. At this step, the layout data (including added/trimmed polygon and main feature) is checked for compliance to one or more mask rules. In embodiments, the data may be modified to provide compliance with the rules. The MRC verifications may be generated based on simulations, mask fabrication data, and/or other suitable methods. Rules checked by MRC may include distance between features.

Figure 12:
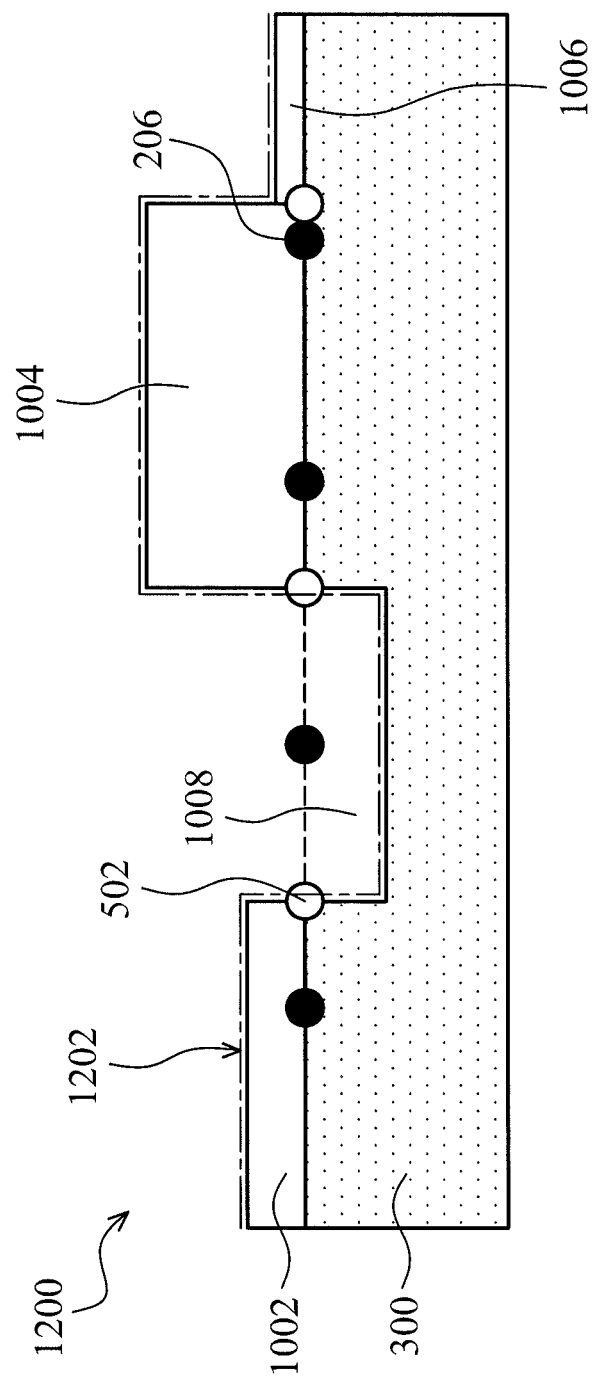
Figure 13:
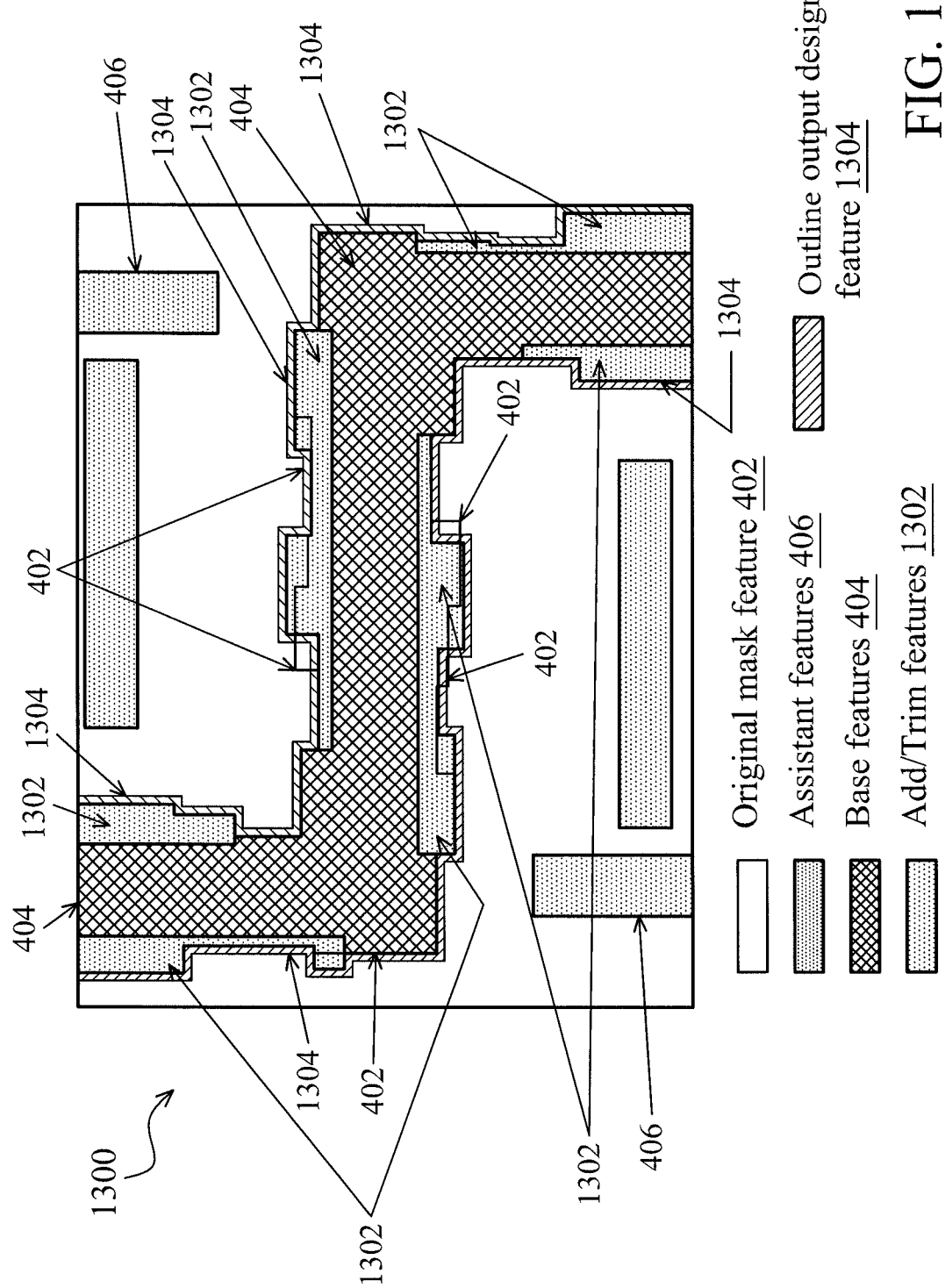

After MRC, an output data design file is provided as illustrated in block 120. The output data design file includes a final feature, which is a combination of the base feature and the added/trimmed polygons (after OPC). The output design file is illustrated by FIGS. 12 and 13. FIG. 12 illustrates an output design feature 1200 which comprises a combination of a base feature 300 (as described above with reference to FIG. 3) with add/trim features 1002, 1004, 1006, 1008. The combination provides a feature having an outline 1202. FIG. 13 illustrates the base feature 404 having the add/trim features 1302 which provides an output design feature that is defined by the outline 1304. The output design feature is the combination of base feature and add/trim features such which provides a feature of the output design file.

The method 100 may continue to fabricate a photomask using the output design data file such that it includes a feature defined by the base feature plus added/trimmed polygons (after OPC). In an embodiment, the outline 1206 of FIG. 12 defines the outline of a feature formed on a photomask fabricated according to an embodiment of the method 100. In an embodiment, the outline 1304 and/or the assistant features 406 of FIG. 13 are illustrative of the layout 1300 formed on a photomask. The method 100 may also further continue to fabricate a semiconductor device, for example, forming one or more layers on a semiconductor wafer that includes a device feature defined by the base feature plus added/trimmed polygons. In an embodiment, the outline 1206 of FIG. 12 defines the outline of a feature formed on a semiconductor wafer fabricated using a design provided according to an embodiment of the method 100. In an embodiment, the outline 1304 of FIG. 13 is illustrative of feature formed on a semiconductor substrate.

Figure 14:
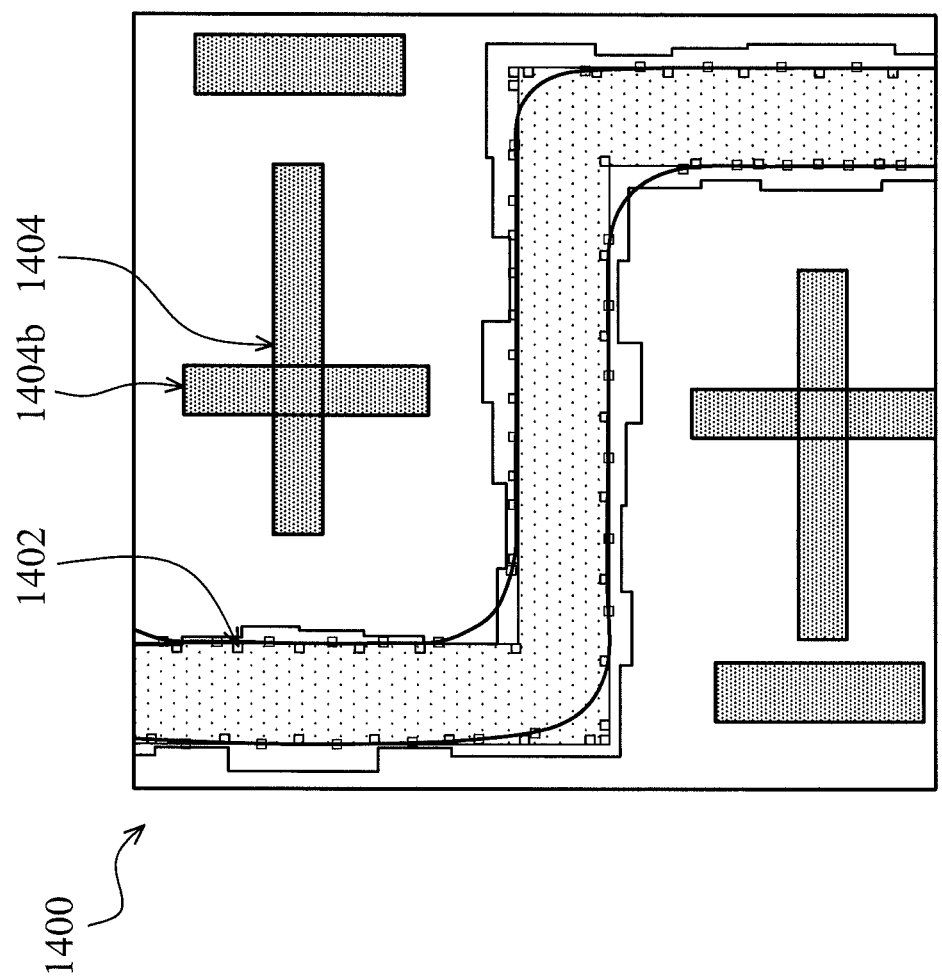

FIG. 14 is illustrative of another embodiment of a layout 1400. The layout 1400 may be disposed on a photomask, illustrative a simulation program, and/or other embodiments. The layout 1400 includes an output design feature (e.g., a mask feature) 1402 and assistant features 1404. In an embodiment, assistant features 1404*b* are disposed perpendicular to the mask feature 1402. In an embodiment, the assistant features 1404*b* are disposed perpendicular to an edge of the mask feature (e.g., that previously had dissection points assigned thereto). In an embodiment, the assistant features 1404*b* are disposed at the points of the mask feature where a "weak location" (e.g., a narrowing of the line) of the as-printed line. The assistant features may be scattering bars. The "weak location" may be determined by simulation, test data, trial-and-error, etc.

Figure 15:
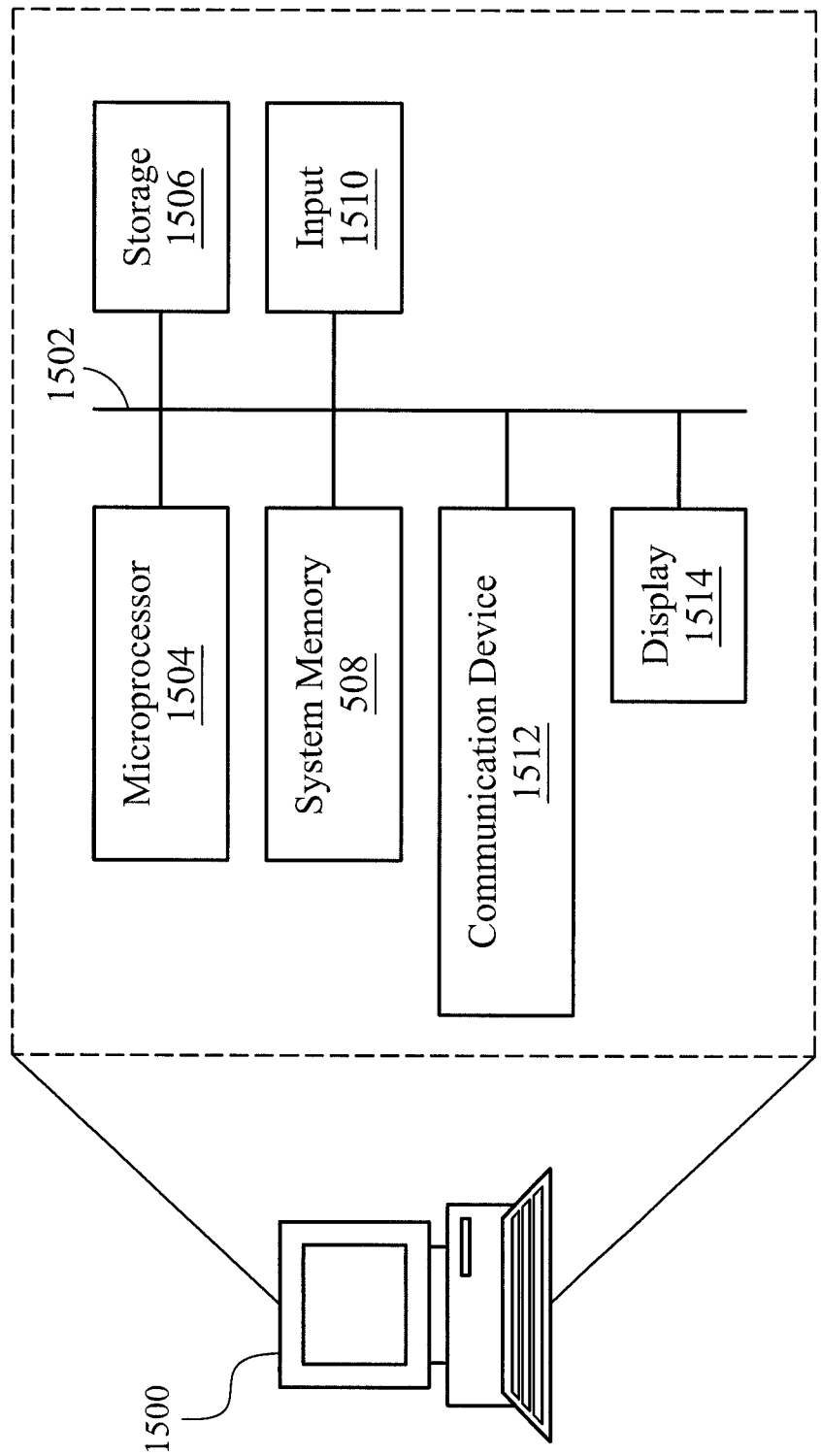
FIG. 15 is illustrative of an embodiment of an information handling system used to implement an embodiment of FIGS. 1-14.

One system for providing the disclosed embodiments of the method 100 and/or the devices of FIGS. 2-14 is illustrated in FIG. 15. Illustrated is an embodiment of an information handling system 1500 for implementing embodiments of the present disclosure including the systems and methods described herein. In an embodiment, the computer system 1500 includes functionality providing for one or more steps of the method of design including preparing, storing, and/or manipulating layout as described above with reference to FIGS. 1-14 and/or performing OPC analysis and implementations as also described above with reference to FIGS. 1-14.

The information handling system 1500 includes a microprocessor 1504, an input device 1510, a storage device 1506, a system memory 1508, a display 1514, and a communication device 1512 all interconnected by one or more buses 1502. The storage device 1506 may be a floppy drive, hard drive, CD-ROM, optical device or any other storage device. In addition, the storage device 1506 may be capable of receiving a floppy disk, CD-ROM, DVD-ROM, or any other form of computer-readable medium that may contain computer-executable instructions. The communications device 1512 may be a modem, a network card, or any other device to enable the computer system to communicate with other nodes. It is understood that any computer system 1500 could represent a plurality of interconnected computer systems such as, personal computers, mainframes, smartphones, and/or other telephonic devices.

The computer system 1500 includes hardware capable of executing machine-readable instructions as well as the software for executing acts (typically machine-readable instructions) that produce a desired result. Software includes any machine code stored in any memory medium, such as RAM or ROM, and machine code stored on other storage devices (such as floppy disks, flash memory, or a CD ROM, for example). Software may include source or object code, for example. In additional software encompasses any set of instructions capable of being executed in a client machine or server. Any combination of hardware and software may comprise an information handling system. The system memory 1508 may be configured to store a design database, algorithms, images, graphs, and/or other information.

Computer readable medium includes non-transitory medium. Computer readable mediums include passive data storage, such as RAM as well as semi-permanent data storage such as a compact disk read only memory (CD-ROM). In an embodiment of the present disclosure may be embodied in the RAM of a computer to transform a standard computer into a new specific computing machine. Data structures are defined organizations of data that may enable an embodiment of the present disclosure. For example, a data structure may provide an organization of data, or an organization of executable code. Data signals could be carried across transmission mediums and store and transport various data structures, and thus, may be used to transport an embodiment of the present disclosure.

The computer system 1500 may be used to implement one or more of the methods and/or devices described herein. In particular, the computer system 1500 may be operable to generate, store, manipulate, analyze, and/or perform other actions on an image associated with an overlay target formed on a semiconductor device. For example, in an embodiment, one or more of the design data formats described above in FIGS. 2-14 may be generated, manipulated, and/or stored using the computer system 1500.

In summary, the methods and devices disclosed herein provide for developing design data suitable for using to fabricate a photomask and/or use to pattern a design on a semiconductor substrate. In doing so, embodiments of the present disclosure offer several advantages over prior art devices. Advantages of the present disclosure include reduction in the time and resources used to perform optical proximity correction (OPC) on a given design. For example, embodiments provide for a method that does not require moving or redefining dissection points of a layout feature during the OPC. In typical design processes, it is required to reassign dissection points for each of multiple "runs" of OPC in order to produce a suitable layout that can be reproduced on a wafer with acceptable fidelity. The use of "pseudo-dissection points," a base feature, add/trim polygons, and/or the other blocks of the method 100 can provide a process where the original dissection points are not modified throughout the design process, including throughout multiple OPC iterations. It is understood that different embodiments disclosed herein offer different disclosure, and that they may make various changes, substitutions and alterations herein without departing from the spirit and scope of the present disclosure.

Thus, it will be appreciated, in one embodiment, a method is described that includes provide design data having a geometric feature. The method further includes preparing a base feature from the geometric feature. The base feature has a substantially linear edge. A pseudo dissection point is then determined on the base feature. A polygon is added or trimmed a polygon from the base feature to form a modified feature. An OPC process is performed on the modified feature to generate an output design. The output design can then be used to fabricate a semiconductor device on a semiconductor substrate.

In a further embodiment, the method includes performing a dissection and target assigning process on the geometric feature (for example, before generating the base feature.) The OPC process may include using a target assigned by the target assigning process. In another embodiment, adding or trimming the polygon includes adding a first polygon on a first portion of a first edge of the base feature and trimming a second polygon on a second portion of the first edge of the base feature.

In a further embodiment, the design data includes providing a file in a graphic database system (GDS) format. In another embodiment, the OPC process on the modified feature further includes determining a first modified feature provides an unacceptable lithographic solution. Thereafter, the added polygon or trimmed polygon is modified (e.g., changed in height). A second OPC process is then performed after modifying the added polygon or the trimmed polygon. Determining that the first modified feature provides an unacceptable lithographic solution may be performed by an OPC system.

In a further embodiment, after performing the OPC process, a mask rule compliance check is performed. The output design may be provided as a file in a graphic database system (GDS) format. In one embodiment, providing the design includes providing the geometric feature having a non-linear edge, and then preparing the base feature includes moving that non-linear edge to provide a single substantially linear edge.

In another of the broader embodiments of the present disclosure, provided is a method of preparing an integrated circuit layout. The method includes providing an optical proximity correction (OPC) system having a processor. A layout of the IC device is delivered to the OPC system. The processor of the OPC system is then used to assign a plurality of dissection points on a non-linear edge of a geometric feature of the layout. After assigning the plurality of dissection points, moving the non-linear edge to form a linear edge of the geometric feature. The geometric feature having the linear edge forms a base feature. The processor is then used to perform at least one of a determination of an inflection point and a simulation to determine a pseudo-dissection point on the base feature different than and spaced a distance from each of the dissection points. A polygon is added to the base feature based on the pseudo-dissection point. After adding the polygon, using the OPC system to perform an OPC process.

In a further embodiment, adding the polygon to the base feature using the pseudo-dissection point includes adding the polygon such that the polygon edge traverses the pseudo-dissection point. In an embodiment, using the OPC system to performing the OPC process includes using the pseudo-dissection points. For example, in lieu of using any dissection points determined and disposed on the original geometric feature. In an embodiment, after using the OPC system, the base feature with polygon added is sent to a lithography system. In an embodiment, after using the OPC system, a photomask is prepared having a feature defined by the base feature with polygon added.

In yet another of the broader embodiments discussed herein, provided is a transitory computer readable medium having stored thereon a program for performing optical proximity correction (OPC) on a layout file representing an integrated circuit. The program includes a set of instructions for performing the steps of modifying a feature of the layout file. The modifying includes moving portions of a non-linear edge of a feature to form a linear edge. The instructions then assign a first temporary (also referred to as pseudo-) dissection point on the linear edge and adding a polygon abutting the linear edge based on the first temporary dissection point. A resolution enhancement technique (RET) (also referred to as OPC) feature is then added to the layout based on the feature having the added polygon.

In a further embodiment, the instructions also include assigning a second temporary dissection point on the linear edge. A polygon is then trimmed from the feature; the trimmed polygon may abut the linear edge at the second temporary dissection point. In such an embodiment, adding the RET feature to the layout is further based on the feature having the trimmed polygon.

In one embodiment, the RET feature includes a scattering bar. The scattering bar may be perpendicular to the linear edge. In an embodiment, the instructions further include, prior to modifying the feature of the layout, assigning a dissection point on the non-linear edge.

What is claimed is:

1. A method semiconductor device design, comprising:
   providing design data having a geometric feature;
   preparing a base feature from the geometric feature, wherein the base feature has a substantially linear edge;
   determining a pseudo-dissection point on the base feature;
   performing at least one of adding a polygon and trimming a polygon from the base feature to form a modified feature, wherein the performing uses the pseudo-dissection point;
   performing optical proximity correction (OPC) process on the modified feature to generate an output design; and
   using the output design to fabricate a semiconductor device on a semiconductor substrate.

2. The method of claim 1, further comprising:
   performing a dissection and target assigning process on the geometric feature prior to preparing the base feature.

3. The method of claim 2, wherein the performing the OPC process includes using a target assigned by the target assigning process.

4. The method of claim 1, wherein the performing the at least one of adding and trimming the polygon includes:
   adding a first polygon on a first portion of a first edge of the base feature; and
   trimming a second polygon on a second portion of the first edge of the base feature.

5. The method of claim 1, wherein providing the design data includes providing a file in a graphic database system (GDS) format.

6. The method of claim 1, wherein performing optical proximity correction (OPC) process on the modified feature further includes:
   determining a first modified feature provides an unacceptable lithographic solution;
   thereafter, modifying the at least one of added polygon and trimmed polygon;
   performing a second OPC process after modifying the at least one of added polygon and trimmed polygon.

7. The method of claim 6, wherein determining the first modified feature provides an unacceptable lithographic solution is performed by an OPC system.

8. The method of claim 1, further requiring:
   after performing the OPC process, performing a mask rule compliance check.

9. The method of claim 1, wherein generating the output design includes providing a file in a graphic database system (GDS) format.

10. The method of claim 1, wherein providing the design includes the geometric feature having a non-linear edge and wherein preparing the base feature includes moving the non-linear edge to provide a single substantially linear edge.

11. A method comprising:
    preparing a base feature having a linear edge from a geometric feature, wherein the geometric feature is based on a design layout;
    assigning a pseudo-dissection point to the base feature;
    forming a modified feature by adding a first polygon to the base feature based on the pseudo-dissection point;
    performing an optical proximity correction (OPC) process on the modified feature to generate an output design; and
    fabricating a device based on the output design.

12. The method of claim 11, wherein forming the modified feature by adding the first polygon to the base feature based on the pseudo-dissection point further includes trimming a second polygon from the base feature.

13. The method of claim 11, further comprising assigning a dissection point to a non-linear edge of the geometric feature prior to preparing the base feature having the linear edge.

14. The method of claim 13, moving the non-linear edge to form the linear edge of the geometric feature based on the dissection point.

15. The method of claim 11, wherein adding the first polygon to the base feature includes adding the first polygon such that an edge of the first polygon traverses the pseudo-dissection point.

16. A method comprising:
    preparing a base feature having a linear edge from a geometric feature, wherein the geometric feature is based on a design layout;
    assigning a pseudo-dissection point to the base feature;
    forming a modified feature by trimming a first polygon from the base feature based on the pseudo-dissection point;
    performing an optical proximity correction (OPC) process on the modified feature to generate an output design; and
    fabricating a device based on the output design.

17. The method of claim 16, wherein forming the modified feature by trimming a first polygon from the base feature based on the pseudo-dissection point further includes adding a second polygon to the base feature.

18. The method of claim 16, wherein performing the OPC process on the modified feature includes modifying the first polygon.

19. The method of claim 18, wherein modifying the first polygon includes modifying a height of the first polygon.

20. The method of claim 16, wherein performing the OPC process on the modified feature includes modifying the pseudo-dissection point assigned to the base feature.

* * * * *